(12) United States Patent
Tran et al.

(10) Patent No.: US 7,378,288 B2
(45) Date of Patent: May 27, 2008

(54) SYSTEMS AND METHODS FOR PRODUCING LIGHT EMITTING DIODE ARRAY

(75) Inventors: Chuong Anh Tran, Orange, CA (US);
Trung Tri Doan, Los Gatos, CA (US)

(73) Assignee: Semileds Corporation, Milpitas, CA (US)

( * ) Notice: Subject to any disclaimer, the term of this patent is extended or adjusted under 35 U.S.C. 154(b) by 0 days.

(21) Appl. No.: 11/032,854

(22) Filed: Jan. 11, 2005

(65) Prior Publication Data

US 2006/0154390 A1 Jul. 13, 2006

(51) Int. Cl.
*H01L 21/00* (2006.01)

(52) U.S. Cl. .............. 438/12; 438/14; 438/15; 257/E21.521; 257/E21.525; 257/E21.526

(58) Field of Classification Search .............. 438/22, 438/34, 46, 12, 14, 15; 257/E21.521, E21.525, 257/E21.526
See application file for complete search history.

(56) References Cited

U.S. PATENT DOCUMENTS

| 4,357,804 | A | | 11/1982 | Beitner |
|---|---|---|---|---|
| 5,446,537 | A | * | 8/1995 | Yoshida et al. ............. 356/256 |
| 5,448,107 | A | | 9/1995 | Osada et al. |
| 5,502,397 | A | * | 3/1996 | Buchanan ................... 324/754 |
| 5,515,683 | A | | 5/1996 | Kessler |
| 5,602,860 | A | | 2/1997 | Masonson |
| 6,023,413 | A | | 2/2000 | Umezawa |
| 6,071,795 | A | | 6/2000 | Cheung et al. |
| 6,161,910 | A | | 12/2000 | Reisenauer et al. |
| 6,221,683 | B1 | | 4/2001 | Nirschl et al. |
| 6,300,590 | B1 | * | 10/2001 | Lauer et al. ............. 219/121.6 |
| 6,329,832 | B1 | * | 12/2001 | Cobbley et al. ............ 324/765 |
| 6,413,839 | B1 | * | 7/2002 | Brown et al. ............... 438/463 |
| 6,455,930 | B1 | | 9/2002 | Palanisamy et al. |
| 6,514,779 | B1 | * | 2/2003 | Ryu et al. .................... 438/17 |
| 6,535,385 | B2 | | 3/2003 | Lee |
| 6,561,261 | B2 | | 5/2003 | Wagner |
| 6,658,041 | B2 | | 12/2003 | Uebbing |
| 6,713,862 | B2 | | 3/2004 | Palanisamy et al. |
| 6,720,570 | B2 | * | 4/2004 | Lee et al. ..................... 257/14 |
| 6,744,071 | B2 | | 6/2004 | Sano et al. |
| 6,770,542 | B2 | | 8/2004 | Plossl et al. |
| 6,800,500 | B2 | | 10/2004 | Coman et al. |
| 6,828,529 | B1 | | 12/2004 | Wu |
| 6,881,602 | B2 | * | 4/2005 | Lee et al. .................... 438/47 |
| 7,202,141 | B2 | * | 4/2007 | Park et al. .................. 438/458 |
| 2002/0177288 | A1 | * | 11/2002 | Brown et al. ............... 438/463 |
| 2003/0003690 | A1 | * | 1/2003 | Nering et al. .............. 438/463 |
| 2003/0011377 | A1 | * | 1/2003 | Oohata et al. .............. 324/512 |
| 2003/0197169 | A1 | * | 10/2003 | Lee et al. ..................... 257/14 |
| 2003/0211645 | A1 | * | 11/2003 | Lee et al. ..................... 438/46 |

(Continued)

FOREIGN PATENT DOCUMENTS

WO WO 2005/029572 A1 3/2005

(Continued)

*Primary Examiner*—Michelle Estrada
*Assistant Examiner*—Jarrett J Stark
(74) *Attorney, Agent, or Firm*—Patterson & Sheridan, LLP (57) ABSTRACT

Systems and methods are disclosed for producing vertical LED array on a metal substrate; evaluating said array of LEDs for defects; destroying one or more defective LEDs; forming good LEDs only LED array suitable for wafer level package.

20 Claims, 5 Drawing Sheets

U.S. PATENT DOCUMENTS

| | | | |
|---|---|---|---|
| 2004/0135158 A1* | 7/2004 | Hon | 257/85 |
| 2004/0245543 A1 | 12/2004 | Yoo | |
| 2005/0263854 A1* | 12/2005 | Shelton et al. | 257/615 |
| 2006/0006554 A1* | 1/2006 | Yoo et al. | 257/900 |

FOREIGN PATENT DOCUMENTS

| | | |
|---|---|---|
| WO | WO 2005/029573 A1 | 3/2005 |

* cited by examiner

FIG 1

(Prior Art)

FIG 2

(Prior Art)

Laser beam

SYSTEMS AND METHODS FOR PRODUCING LIGHT EMITTING DIODE ARRAY

This invention relates to semiconductor manufacture and more particularly to a method and apparatus for manufacturing light emitting diodes (LEDs) array.

One of the fastest growing segments of the semiconductor industry is the manufacture of multi-chip modules (MCM). Multi-chip modules are being increasingly used in computers to form PC chip sets and in telecommunication items such as modems and cellular telephones. In addition, consumer electronic products such as watches and calculators typically include multi-chip modules.

With a multi-chip module, non-packaged or LEDs (i.e., chips) are secured to a substrate (e.g., printed circuit board) using an adhesive. Electrical connections are then made directly to the bond pads on each LED and to electrical leads on the substrate.

In an effort to minimize the cost and maximize the quality of assembled packages, steps are typically taken to ensure that only LEDs which are found to be functional are assembled with one another. Therefore, prior to the LED attachment process, LEDs and carrier substrates are typically tested for optical and electrical defects, contamination, and other irregularities. LEDs in the array found to be defective are typically marked in a manner so as to distinguish them from known good components.

Thus, with unpackaged LEDs, semiconductor manufacturers are required to supply LED arrays that have been tested and certified as known good LED. On a parallel note, light-emitting diodes (LEDs) are playing an increasingly important role in our daily life. Traditionally, LEDs have become ubiquitous in many applications, such as communications and other areas, such as mobile phones, appliances and other electronic devices. Recently, the demand for nitride based semiconductor materials (e.g., having gallium nitride or GaN) for opto-electronics has increased dramatically for applications such as video displays, optical storage, lighting, medical instruments, for example.

Conventional blue light-emitting diodes (LEDs) are formed using semiconductor materials of nitride, such as GaN, AlGaN, InGaN and AlInGaN. Most of the semiconductor layers of the aforementioned light-emitting devices are epitaxially formed on electrically non-conductive sapphire substrates. Since the sapphire substrate is an electrical insulator, electrodes cannot be directly formed on the sapphire substrate to drive currents through the LEDs. Rather, the electrodes directly contact a p-type semiconductor layer and an n-type semiconductor layer individually, so as to complete the fabrication of the LED devices. However such configuration of electrodes and electrically non-conductive nature of sapphire substrate represents a significant limitation for the device operation. For example, a semi-transparent contact needs to be formed on the p-layer to spread out the current from p-electrode to n-electrode. This semi-transparent contact reduces the light intensity emitted from the device due to internal reflectance and absorption. Moreover, p and n-electrodes obstruct the light and reduce the area of light emitting from the device. Additionally, the sapphire substrate is a heat insulator (or a thermal insulator) and the heat generated during the device operation can not be effectively dissipated, thus limiting the device reliability.

Figure 1:
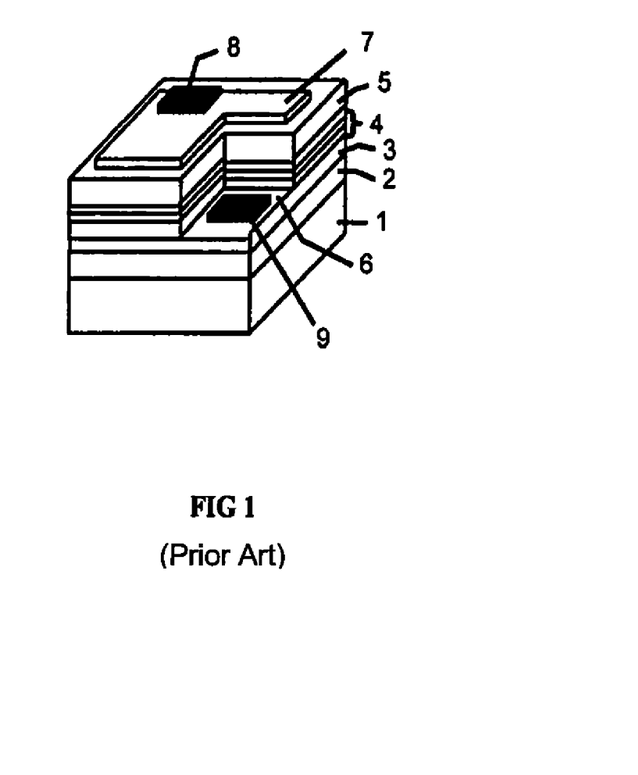
FIG. 1 shows a prior art conventional LED.

FIG. 1 shows one such conventional LED. As shown therein, the substrate is denoted as 1. The substrate 1 can be mostly sapphire. Over the substrate 1, a buffer layer 2 is formed to reduce the lattice mismatch between substrate 1 and GaN. The buffer layer 2 can be epitaxially grown on the substrate 1 and can be AlN, GaN, AlGaN or AlInGaN. Next, an n-GaN based layer 3, a multi-quantum well (MQW) layer 4, and a p-GaN layer 5 are formed in sequence. An etching method is employed to form an exposing region 6 on the n-GaN based layer 3. An electrically conductive semi-transparent coating is provided above the p-GaN layer 5. Finally, the n-electrode 9 and p-electrode 8 are formed on selected electrode areas. The n-electrode 9 is needed on the same side of the device as the p-electrode to inject electrons and holes into the MQW active layer 4, respectively. The radiative recombination of holes and electrons in the layer 4 emits light. However, limitations of this conventional LED structure include: (1) Semi-transparent contact on p-layer 5 is about 70% transparent at best and can block the light emitted from layer 4; (2) current spreading from n-electrode to p-electrode is not uniform due to position of electrodes; and (3) heat is accumulated during device operation since sapphire is a thermal and electrical insulator.

Figure 2:
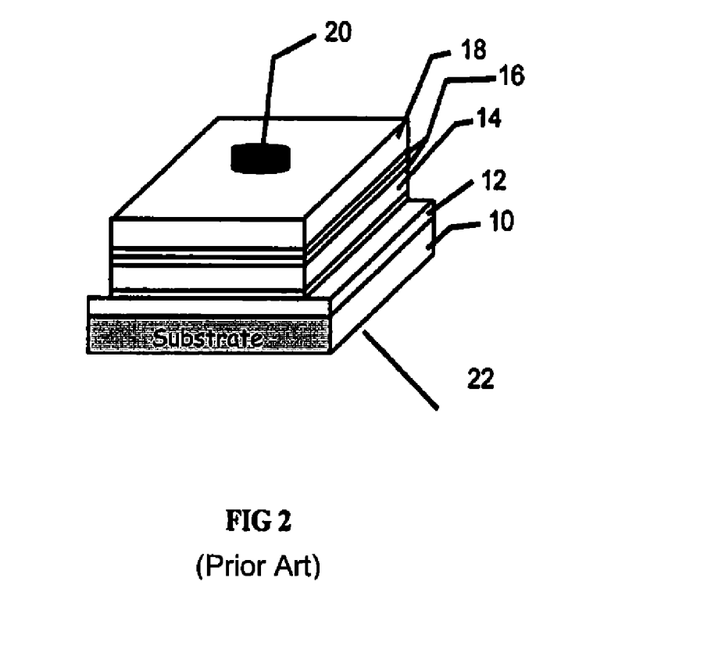
FIG. 2 shows a prior art vertical LED.

To increase available lighting area, vertical LEDs have been developed. As shown in FIG. 2, a typical vertical LED has a substrate 10 (typically silicon, GaAs or Ge). Over the substrate 10, a transition metal multi-layer 12, a p-GaN layer 14, an MQW layer 16, and an n-GaN layer 18 are then formed. The n-electrode 20 and the p-electrode 22 are then formed on selected areas as electrodes.

U.S. patent Application Ser. No. 20040135158 shows one way to realize vertical LED structure by (a) forming a buffering layer over a sapphire substrate; (b) forming a plurality of masks over said buffering layer, wherein said substrate, said buffering layer and said plurality of masks jointly form a substrate unit; (c) forming a multi-layer epitaxial structure over said plurality of masks, wherein said multi-layer epitaxial structure comprises an active layer; extracting said multi-layer epitaxial structure; (d) removing said remaining masks bonding with a bottom side of said multi-layer epitaxial structure after extracting; (e) coating a metal reflector over said bottom side of said multi-layer epitaxial structure; (f) bonding a conductive substrate to said metal reflector; and (g) disposing a p-electrode over an upper surface of said multi-layer structure and an n-electrode over a bottom side of said conductive substrate.

SUMMARY

In one aspect, systems and methods are disclosed for producing vertical LED including forming an array of LEDs on a metal substrate; evaluating said array of LEDs for defects; destroying or removing one or more defective LEDs and then forming arrays containing only good LEDs. These good LEDs only array then can be packaged including at the wafer level to serve the purpose of multi chip power LED device.

Implementations of the above aspect can include one or more of the following. The destroying includes vaporizing a defective LED, or alternatively includes applying a laser beam on a defective LEDs or using laser cutting to cut thru the metal substrate to remove them. Electrical functionality can be done for testing each of said plurality of LED to identify a satisfactorily nondefective LED. Nondefective LEDs are then supplied in form of array ready for packaging including wafer level packaging.

Advantages of the system may include one or more of the following. The above system provide manufacturing processes suitable for fabricating and testing or unpackaged vertical LEDs on metal substrate. The present method of manufacturing and checking LEDs is suitable for the burn-in and checking in practice all kind of LEDs, especially the vertical LED on metal substrate described in this invention. It is highly economical because it provides testing before final component fabrication, making the present method highly reliable in comparison with conventional methods. In addition to enhancing the standard manufacturing testing for LEDs, the system can be a major development for producing good LEDs array Such improvements can improve-packaging assembly, screening, and assembly yields, dramatically reducing costs. Additionally, overall product failure rates can potentially be reduced, thereby improving system and life cycle costs, minimizing program delays and cost associated with component fails late within system integration.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

To better understand the other features, technical concepts and objects of the present invention, one may clearly read the description of the following preferred embodiments and the accompanying drawings, in which.

DESCRIPTION

In reading the detailed description, the accompanying drawings may be referenced at the same time and considered as part of the detailed description.

Referring to FIGS. 3 to 8, a manufacturing method for vertical LEDs on metal substrate is illustrated therein. In the description, the reference numerals given for the inventive device structure will be also used in the recitation of the steps of the inventive manufacturing method.

The process described below is for one embodiment with InGaN LEDs initially grown on sapphire. Electro or Electroless Chemical plating is then used to deposit a thick metal substrate for electrical and thermal conduction for the resulting LED device. Electro or Electroless Chemical plating is used in lieu of wafer bonding. The process can be applied to any optoelectronic device where bonding was used to attach the epilayer to a new host substrate for improvement of optical, electrical and thermal properties.

Figure 3:
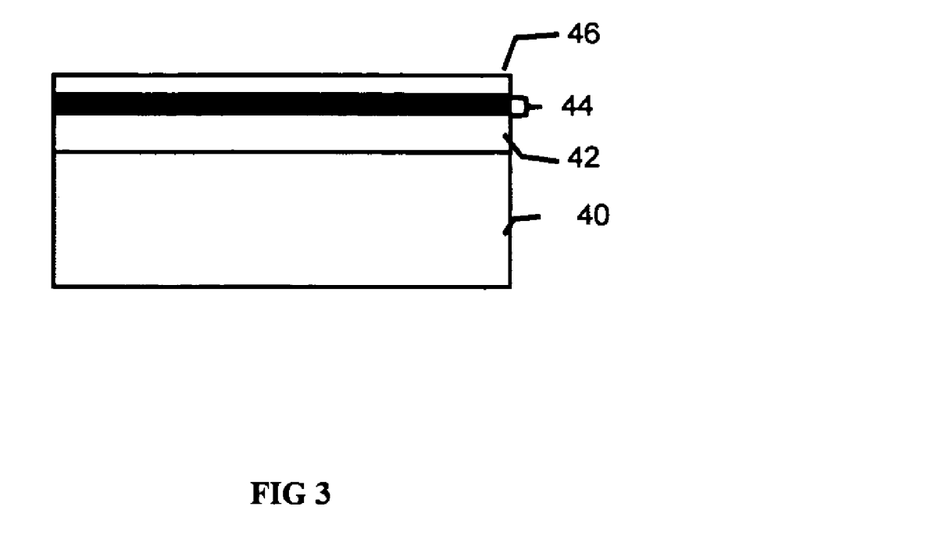
FIGS. 3-8 show operations in an exemplary process to fabricate vertical LED on metal substrate.

Turning now to the diagrams, FIG. 3 shows a multi-layer epitaxial structure of an exemplary InGaN LED on a carrier 40, which can be a sapphire substrate in one embodiment. The multi-layer epitaxial structure formed above the sapphire substrate 40 includes an n-GaN based layer 42, an MQW active layer 44 and a contact layer 46. The n-GaN based layer 42 having a thickness of about 4 microns, for example.

The MQW active layer 44 can be an InGaN/GaN (or InAlGaN/GaN) MQW active layer. Once an electric power is fed between the n-GaN based layer 42 and the contact-layer 46, the MQW active layer 44 may be excited and thus generates a light. The produced light can have a wavelength between 250 nm to 600 nm. The p-layer can be a $p^+$-GaN based layer, such as a $p^+$-GaN, a $p^+$-InGaN or a $p^+$-AlInGaN layer and the thickness thereof may be between 0.01-0.5 microns.

Figure 4:
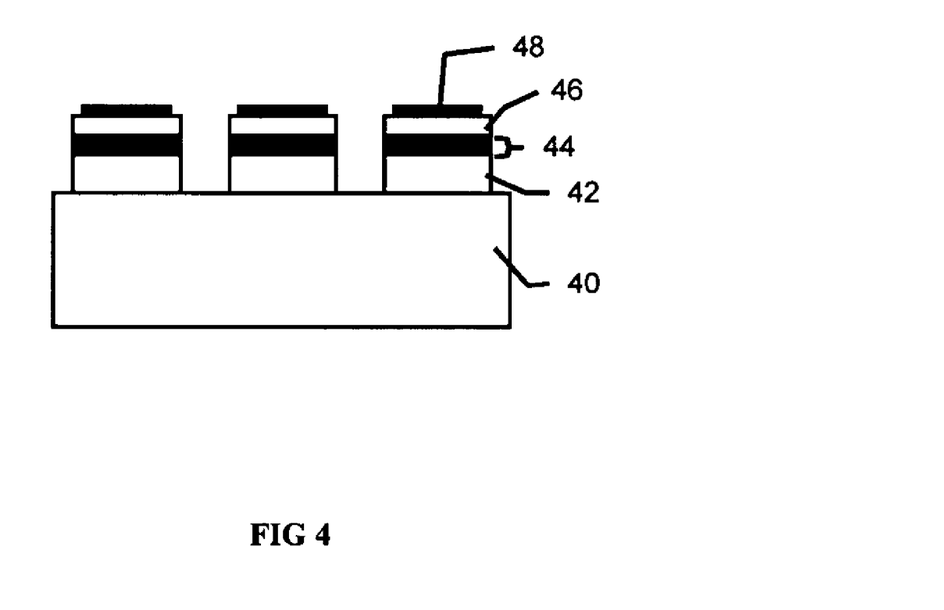

Next, as shown in FIG. 4, a mesa definition process is performed and p-type contacts 48 are formed above the contact layer 46. The contacts 48 above the multi layer epitaxial structure can be Indium Tin Oxide (ITO), Ag, Al, Cr, Ni, Au, Pt, Pd, Ti, Ta, TiN, TaN, Mo, W, a refractory metal, or a metal alloy, or a composite of these materials (for example Ni/Au), among others. In addition, direct reflected Ag deposition as a metal contact could be also formed. In FIG. 4, individual LED devices are formed following mesa definition. Ion coupled plasma etching is used to etch GaN into separate devices.

Figure 5:
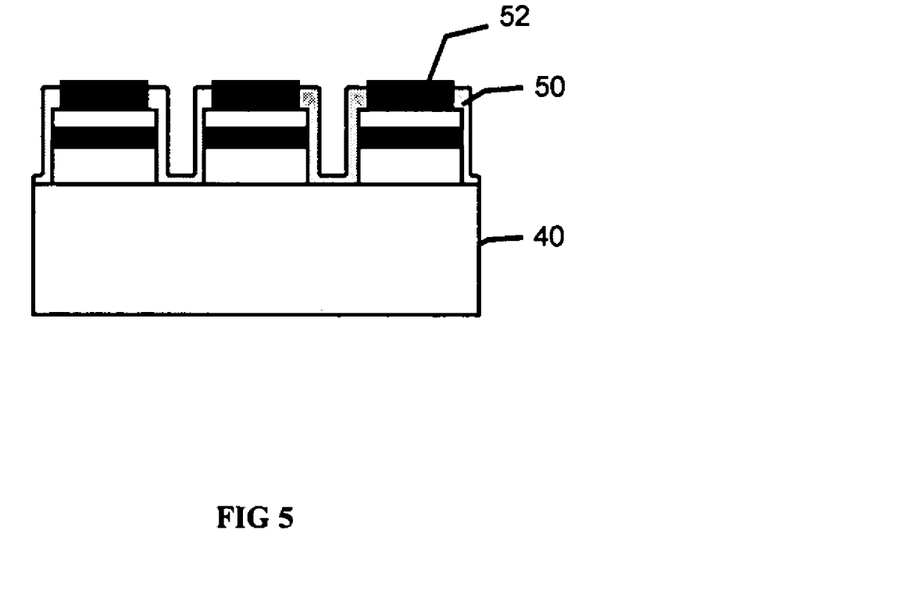

Next, as shown in FIG. 5, a passivation layer 50 is deposited and reflective metal deposition is performed to form a reflective metal 52 such as Al, Ag, Ni, Pt and Cr, among others, in a window etched into the passivation layer 50 to allow the reflective metal 52 to contact layer 46. The passivation layer 50 is non-conductive. The reflective metal 52 forms a mirror surface.

Figure 6:
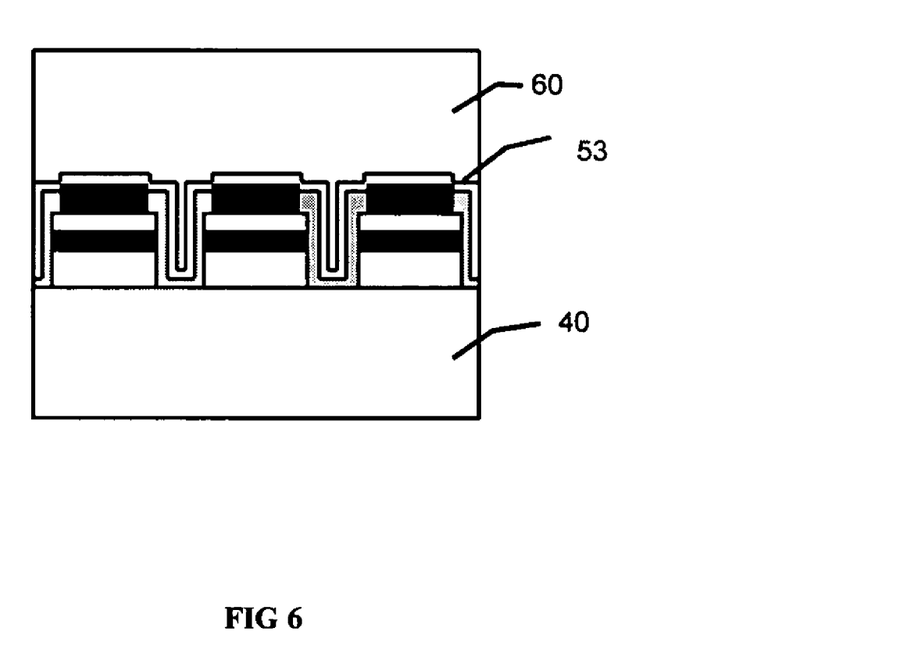

FIG. 6 shows that a thin metal layer or a multi-metal layer 53 (Cr, Pt, Pd, Pt/Au, Cr/Au, Ni/Au, Ti/Au, TaN/Au among others) is deposited over the structure to serve as a barrier/seed layer for the electro/electroless chemical plating process. However the depositing operation is not needed if an electroless chemical process, sputtering or magneto-sputtering process is used in lieu of electroplating. A metal substrate layer 60 is deposited thereon.

Figure 7:
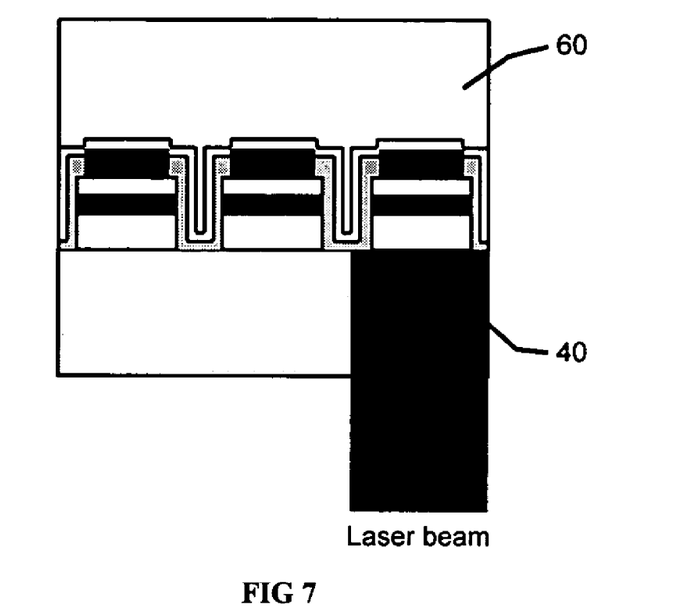

Turning now to FIG. 7, the multi-layer epitaxial structure is coated with a metal plating layer 60 using techniques such as electro and electroless chemical plating. With electroless chemical plating, the sapphire substrate 40 is protected using a organic or polymer layer or a coating that can be easily removed without damaging the sapphire or the electroless chemical plated metal of a relatively thick metal such as Ni, Cu, Ag, W, Mo, Pd, Pt, among others.

Figure 8:
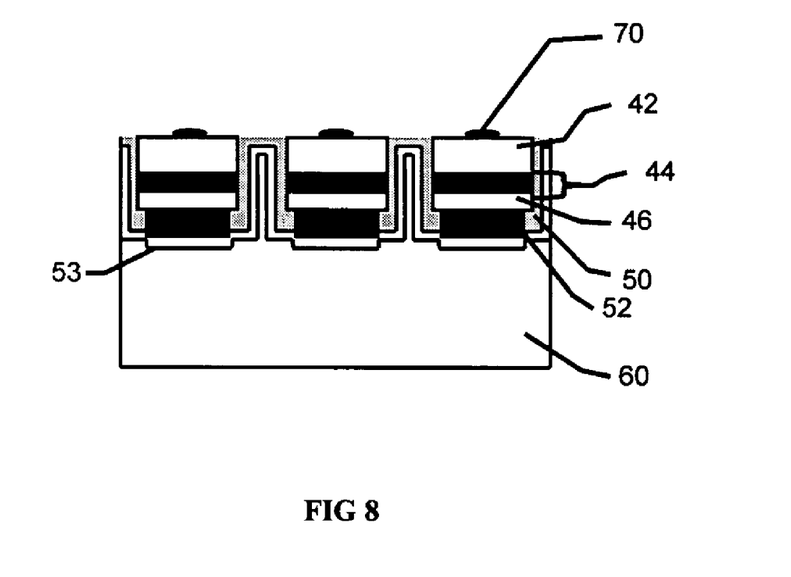

Next, the sapphire substrate 40 is removed. In one embodiment shown in FIG. 7, a laser lift-off (LLO) operation is applied to the sapphire substrate 40. Sapphire substrate removal using laser lift-off is known, reference U.S. Pat. No. 6,071,795 to Cheung et al, entitled, "Separation of Thin Films From Transparent Substrates By Selective Optical Processing," issued on Jun. 6, 2000, and Kelly et al. "Optical process for liftoff of group III-nitride films", Physica Status Solidi (a) vol. 159, 1997, pp. R3-R4). Furthermore, highly advantageous methods of fabricating GaN semiconductor layers on sapphire (or other insulating and/or hard) substrates are taught in U.S. patent application Ser. No. 10/118,317 entitled "A Method of Fabricating Vertical Devices Using a Metal Support Film" and filed on Apr. 9, 2002 by Myung Cheol Yoo, and in U.S. patent application Ser. No. 10/118,316 entitled "Method of Fabricating Vertical Structure" and filed on Apr. 9, 2002 by Lee et al. Additionally, a method of etching GaN and sapphire (and other materials) is taught in U.S. patent application Ser. No. 10/118,318 entitled "A Method to Improve Light Output of GaN-Based Light Emitting Diodes" and filed on Apr. 9, 2002 by Yeom et al., all of which are hereby incorporated by reference as if fully set forth herein. As shown in FIG. 8, an n-type electrode 70 such as Cr/Ni is patterned on the top of n-GaN layer 42 to complete the vertical LED.

At this stage, all the LEDs on metal substrate are probed and mapped for defects. Wafer mapping is performed to test the gross functionality of the LEDs on the wafer. Normally for each LED, wavelength, brightness, forward voltage at certain driving current and leakage current at certain reverse bias are recorded in the mapping data. The nonfunctional LEDs are mechanically marked or mapped in software. Positions of each bad LED could be traced back for the purpose of removing them for subsequent separation into known-good LEDs only arrays.

Figure 9:
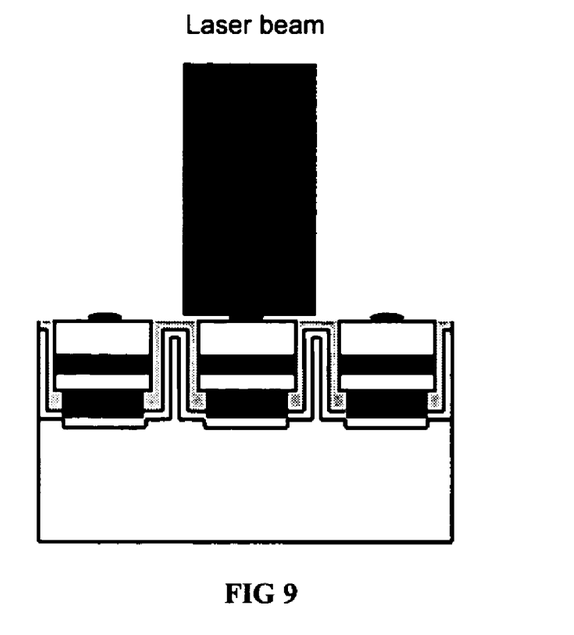
FIG. 9 shows the way how to remove a bad LED using laser beam. The bad LED is either evaporated or removed by cutting through the metal substrate along the kerfs bordering the bad LED.
Figure 10:
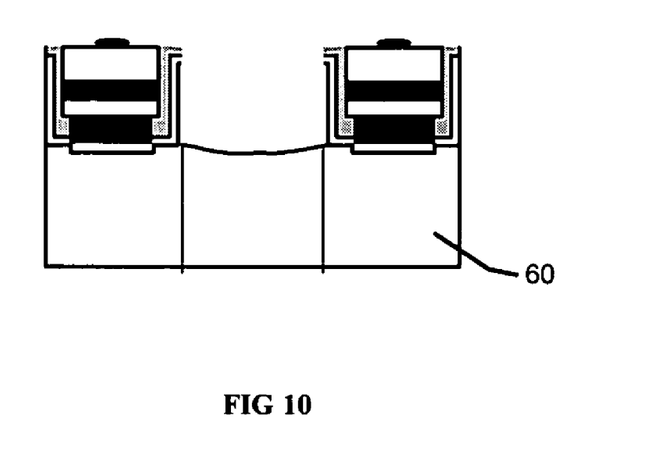
FIG. 10 shows the empty space where the bad LED was positioned before removal.

A laser is used to destroy non-functioning LEDs. As shown in the example of FIG. 9, the middle LED is defective and the laser burns up the middle LED structure prior to the next operation. The laser can be an UV-Diode Pump Solid State (DPSS) laser or excimer laser with wavelength at 266 nm or 355 nm or 248 nm, for example. All laser wavelengths are strongly absorbed by GaN and any metal used as metal substrate. This total absorption results in total energy transfer from laser pulse into the defective LED and elevate its temperature to higher temperature than evaporation temperature of GaN. When burning a defective LED on the wafer level, a laser pulse is radiated and repeated until the LED is totally evaporated.

A second way to remove a bad LED or a cluster of bad LEDs is using the laser beam to cut the LED off the metal substrate. In this case the laser beam is guided along kerfs bordering the LED. The laser beam can be stationary while the metal substrate moves to achieve the same effect. A third way to remove a bad LED or a cluster of bad LEDs is using diamond saw cut.

In addition to performing the functions outlined above, the system may include computer hardware and software capable of monitoring, controlling and collecting process data. This data collection capability allows process monitoring and permits real-time traceability of devices. This permits faster internal process feedback specific to device performance to be generated without introducing final packaging process variations.

In association with vertical LED on metal substrate, this invention can be used for producing known good LED arrays, ready for wafer level packaging.

While the invention has been described with reference to certain preferred embodiments, as will be apparent to those skilled in the art, certain changes and modifications can be made without departing from the scope of the invention as defined by the following claims.

What is claimed is:

1. A method for producing known good (light-emitting diode) LED structures, comprising:
   providing LED structures having a metal substrate deposited thereon, wherein the LED structures comprise multiple epitaxial layers;
   evaluating said LED structures for defects including optical and electrical non-functionality compared to preset criteria; and
   removing one or more defective LED structures by removing the multiple epitaxial layers of the defective LED structures such that the known good LED structures remain on the metal substrate.

2. The method of claim 1, wherein the removing one or more defective LED structures comprises vaporizing a defective LED structure using a laser to elevate a temperature of the defective LED structure to higher than an evaporation temperature.

3. The method of claim 1, wherein the removing one or more defective LED structures comprises applying a laser beam to cut the defective LED structures from the metal substrate.

4. The method of claim 1, wherein the evaluating process comprises performing optical and electrical functionality testing on each of said LED structures to identify the known good LED structures and the defective LED structures.

5. The method of claim 1, further comprising packaging the known good LED structures at a wafer level.

6. The method of claim 1, wherein the LED structures comprise:
   an n-type layer made from one of: GaN and AlGaN;
   one or more quantum wells with InAlGaN/GaN layers; and
   a p-type layer made from one of: GaN and AlGaN.

7. The method of claim 1, wherein the metal substrate comprises at least one of Silver, Al, Cr, Pt, Ni, Au, Mo, W, a refractory metal, or a metal alloy thereof.

8. A method for producing a known good (light-emitting diode) LED array, comprising:
   providing an array of LED structures, the array having a metal substrate deposited thereon, wherein the LED structures comprise multiple epitaxial layers;
   evaluating said array of LED structures for defects including optical and electrical non-functionality compared to a preset criteria; and
   removing one or more defective LED structures from the metal substrate by removing the multiple epitaxial layers of the defective LED structures.

9. The method of claim 8, wherein the removing process comprises vaporizing a defective LED structure using a laser to elevate a temperature of the defective LED structure to higher than an evaporation temperature.

10. The method of claim 8, wherein the removing one or more defective LED structures comprises applying a laser beam to cut the defective LED structures from the metal substrate.

11. The method of claim 8, wherein the evaluating process comprises performing optical and electrical functionality testing on each of said LED structures to identify the defective LED structures.

12. The method of claim 8, further comprising packaging the known good LED array at a wafer level.

13. The method of claim 8, wherein the LED structures comprise:
   an n-type layer made from one of: GaN and AlGaN;
   one or more quantum wells with InAlGaN/GaN layers; and
   a p-type layer made from one of: GaN and AlGaN.

14. The method of claim 8, wherein the metal substrate comprises at least one of Silver, Al, Cr, Pt, Ni, Au, Mo, W, a refractory metal, or a metal alloy thereof.

15. A method of manufacturing a vertical (light-emitting diode) LED array on a metal substrate, comprising:
   providing a carrier substrate;
   depositing an n-GaN layer above the carrier substrate;
   depositing active layers above the n-GaN portion;
   depositing a p-GaN layer above the active layers;
   depositing one or more first metal layers above the p-GaN layer;
   applying a masking layer above the first metal layers;
   etching the first metal layers, the p-GaN layer, the active layers, and the n-GaN layer to define a plurality of LED structures;
   removing the masking layer;
   depositing a passivation layer;

removing a portion of the passivation layer on top of the p-GaN layer to expose the first metal layers;

depositing one or more second metal layers to form the metal substrate;

removing the carrier substrate to expose a surface of the n-GaN layer;

evaluating each of the LED structures for a defect using mapping; and removing one or more defective LED structures from the metal substrate by removing the n-GaN, active, and p-GaN layers of the defective LED structures.

16. The method of claim 15, wherein the removing process comprises vaporizing a defective LED structure using a laser to elevate a temperature of the defective LED structure to higher than an evaporation temperature.

17. The method of claim 15, wherein the removing one or more defective LED structures comprises applying a laser beam to cut the defective LEDs from the metal substrate.

18. The method of claim 15, wherein the removing one or more defective LED structures comprises using a saw blade to cut the defective LED structures from the metal substrate.

19. The method of claim 15, wherein the metal substrate comprises at least one of copper, nickel, silver, platinum, aluminum, Mo, or tungsten.

20. The method of claim 15, wherein depositing the second metal layers to form the metal substrate comprises depositing Copper using one of electro plating or electroless plating.

* * * * *